United States Patent
Menezes

(10) Patent No.: US 9,799,395 B2
(45) Date of Patent: Oct. 24, 2017

(54) SENSE AMPLIFIER IN LOW POWER AND HIGH PERFORMANCE SRAM

(71) Applicant: TEXAS INSTRUMENTS INCORPORATED, Dallas, TX (US)

(72) Inventor: Vinod Menezes, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/954,481

(22) Filed: Nov. 30, 2015

(65) Prior Publication Data

US 2017/0154672 A1    Jun. 1, 2017

(51) Int. Cl.
G11C 11/00 (2006.01)
G11C 11/419 (2006.01)
G11C 11/412 (2006.01)
G11C 11/413 (2006.01)

(52) U.S. Cl.
CPC .......... *G11C 11/419* (2013.01); *G11C 11/412* (2013.01); *G11C 11/413* (2013.01)

(58) Field of Classification Search
None
See application file for complete search history.

(56) References Cited

U.S. PATENT DOCUMENTS

| 7,330,388 B1 | 2/2008 | Chapman et al. |
| 2007/0159899 A1* | 7/2007 | Ramadurai ............ G11C 7/065 365/201 |
| 2008/0084228 A1 | 4/2008 | Liu et al. |

OTHER PUBLICATIONS

PCT International Search Report for corresponding PCT Application No. PCT/US2016/064183, dated Feb. 27, 2017 (2 pages).

* cited by examiner

*Primary Examiner* — Son Dinh
*Assistant Examiner* — Uyen B Tran
(74) *Attorney, Agent, or Firm* — John R. Pessetto; Charles A. Brill; Frank D. Cimino

(57) ABSTRACT

A static random access memory (SRAM) includes an array of storage cells and a first sense amplifier. The array of storage cells is arranged as rows and columns. The rows correspond to word lines and the columns correspond to bit lines. The first sense amplifier includes a first transistor and a second transistor. The first sense amplifier is configured to provide a first read of a first storage cell of the array of storage cells. Based on the first read of the first storage cell failing to correctly read data stored in the first storage cell, the first sense amplifier is configured to increment a body bias of the first transistor a first time. In response to the body bias of the first transistor being incremented, the first sense amplifier is configured to provide a second read of the first storage cell.

12 Claims, 3 Drawing Sheets

SENSE AMPLIFIER IN LOW POWER AND HIGH PERFORMANCE SRAM

BACKGROUND

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. While SRAM is fast, it also consumes a significant portion of system's level dynamic power. In some cases SRAM may consume as much as 90% of the system level dynamic power.

SUMMARY

The problems noted above are solved in large part by systems and methods for reducing power consumption and increasing speed in static random access memory (SRAM). In some embodiments, a SRAM includes an array of storage cells and a first sense amplifier. The array of storage cells is arranged as rows and columns. The rows correspond to word lines and the columns correspond to bit lines. The first sense amplifier includes a first transistor and a second transistor. The first sense amplifier is configured to provide a first read of a first storage cell of the array of storage cells. Based on the first read of the first storage cell failing to correctly read data stored in the first storage cell, the first sense amplifier is configured to increment a body bias of the first transistor a first time. In response to the body bias of the first transistor being incremented, the first sense amplifier is configured to provide a second read of the first storage cell.

Another illustrative embodiment is a method for reducing power consumption and increasing speed in SRAM. The method may comprise writing known data into a plurality of storage cells of an array of storage cells arranged as rows and columns. The method may also comprise reading a first storage cell of the plurality of storage cells a first time. The method may also comprise, based on the reading the first storage cell the first time failing to correctly read the known data from the first storage cell, incrementing a body bias of a first transistor of a first sense amplifier of the SRAM. The method may also comprise, in response to the body bias of the first transistor being incremented, reading the first storage cell a second time.

Yet another illustrative embodiment is a SRAM sense amplifier comprising a first transistor and a second transistor. The second transistor is cross coupled with the first transistor. The first transistor is configured to receive a body bias such that a voltage threshold of the first transistor is approximately equal to a voltage threshold of the second transistor.

BRIEF DESCRIPTION OF THE DRAWINGS

For a detailed description of various examples, reference will now be made to the accompanying drawings in which.

NOTATION AND NOMENCLATURE

Figure 1:
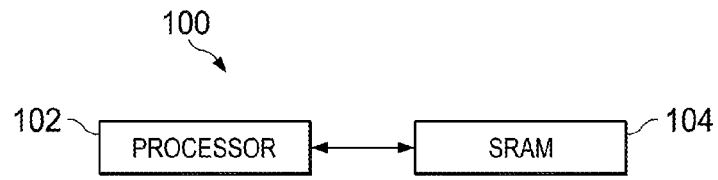
FIG. 1 shows a block diagram of an integrated circuit in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Static random access memory (SRAM) is memory that utilizes latching to store each bit. Because SRAM is static, there is no need to periodically refresh the memory, and is, therefore, typically faster, less dense, and more expensive, than dynamic random-access memory (DRAM). Due to SRAM's speed, SRAM is typically used in computer applications that require a fast memory such as cache memory for the central processing unit (CPU), external burst mode SRAM caches, hard disk buffers, router buffers, CPU register files, etc. Therefore, SRAM is a fundamental building block of many systems. While SRAM is fast, it also consumes a significant portion of system's level dynamic power. In some cases SRAM may consume as much as 90% of the system level dynamic power. Therefore, it is desirable to reduce the power consumption of SRAM while increasing speed.

Whenever a storage cell in a storage cell array of a memory is to be read, a precharge of the bit lines is initiated. Once the bit lines are precharged in the conventional SRAM, the word line corresponding to the row in which the storage cell to be read is activated. This creates a differential voltage in a differential pair of bit lines corresponding to the columns containing the storage cell being read. A sense amplifier to then may be utilized to read the contents of the storage cell by sensing the differential voltage. The sense amplifier compares the differential pair of bit lines to determine which of the bit lines is HIGH and which is LOW. Based on this comparison, the sense amplifier makes a determination as to what is stored in the storage cell. However, in real operations, it is possible that the differential voltage inputs into the sense amplifier are skewed which may cause an imbalance, or offset in the sense amplifier. More particularly, many conventional sense amplifiers contain two sensing transistors. Due to many factors, the two sensing transistors may have slightly different voltage thresholds. For example the voltage threshold of one of the sense transistors may be a few mV higher or lower than the other sense transistor. This imbalance, or offset, may cause the sense amplifier to provide an incorrect determination as to what data is stored in the storage cell, especially whenever the difference in voltage in the differential pair is very small. Conventional techniques utilized to cancel the offset of the transistors in a sense amplifier include turning on and/or off transistors within the sense amplifier to balance the offset or adding a separate voltage on the input of sense amplifier to cancel the offset effect. However, these techniques either require additional power and/or slow the access time of the memory. Therefore, it is desirable to create a sense amplifier in memory that reduces power consumption and increases speed (i.e., reduces access times).

In accordance with the disclosed principles, a sense amplifier may include two transistors. The voltage threshold of the two transistors may be controlled by providing adaptive body bias to the transistors (i.e., a voltage to the back of the gate of the transistors). For example, if the transistors are n-channel metal oxide semiconductor field effect (NMOS) transistors, applying a positive body bias voltage to the transistor decreases the voltage threshold of the transistor while applying a negative body bias voltage to the transistor increases the voltage threshold of the transistor. Therefore, by applying the adaptive body bias to the sense transistors of the sense amplifier in the SRAM, the offset may be reduced or removed. Because the swing required to be produced by the sense amplifier is related to the offset (i.e., the larger the offset, the larger the swing required to read the storage cell), power may be reduced by lowering the offset. Additionally, by reducing offset, the sense amplifier is capable of making an accurate determination of the difference between the voltages of the differential pair of bit lines with smaller voltage differentials. Therefore, a reduced offset sense amplifier may sense the voltage differential at an earlier time during the bit cell discharge than an offset sense amplifier. Thus, by providing adaptive body bias to the sense transistors of the sense amplifier, power and access times may be reduced.

FIG. 1 shows a block diagram of an integrated circuit 100 in accordance with various embodiments. Integrated circuit 100 may include processor 102 and SRAM 104, which may, in some embodiments, be coupled to processor 102. Integrated circuit 100 may also include various additional components, such as transceivers, clock generators, ports, etc.; however, these components have been omitted to promote clarity. Processor 102 may be a control processor, a signal processor, a central processor, or any other type of processor. Processor 102 may be, for example, a general-purpose microprocessor, a digital signal processor, a microcontroller, or other suitable device configured to execute instructions for performing operations. Processor architectures generally include execution units (e.g., fixed point, floating point, integer, etc.), instruction decoding, peripherals (e.g., interrupt controllers, timers, direct memory access controllers, etc.), input/output systems (e.g., serial ports, parallel ports, etc.) and various other components and sub-systems.

SRAM 104 is static random access memory which may provide storage of data and/or instructions that are capable of being processed by processor 102. SRAM 104 is designed such that it exhibits data remanence and utilizes latching circuitry to store each bit of data. SRAM 104 is coupled to processor 102 such that processor 102 may read from and/or write data and/or instructions to SRAM 104 for storage. In some embodiments, SRAM 104 is a part of processor 102 while in alternative embodiments, SRAM 104 is distinct from processor 102. Furthermore, multiple SRAMs 104 may be included in integrated circuit 100.

Figure 2:
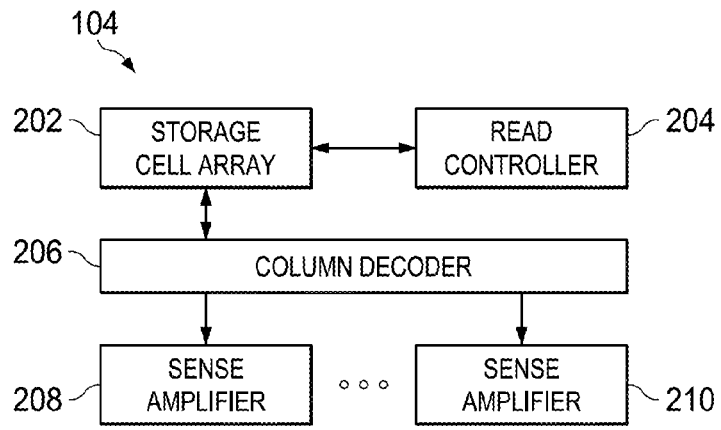
FIG. 2 shows a block diagram of a static random access memory (SRAM) in accordance with various embodiments.

FIG. 2 shows a block diagram of a SRAM 104 in accordance with various embodiments. SRAM 104 may include storage cell array 202, read controller 204, column decoder 206, and sense amplifiers 208-210. Storage cell array 202 may be arranged as rows and columns of storage cells, sometimes referred to as bit cells, each storage cell storing one bit of data.

Figure 3:
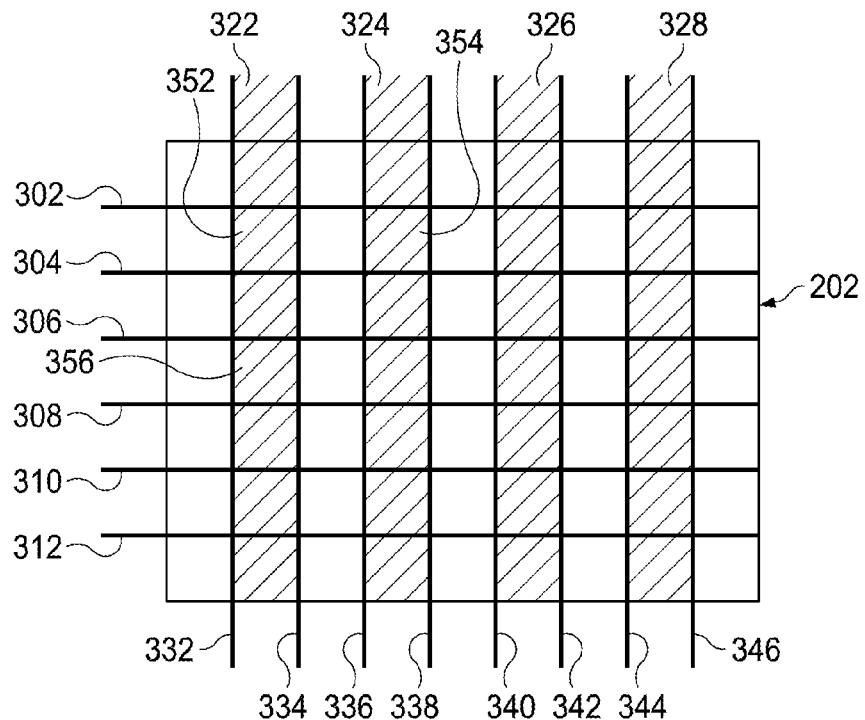
FIG. 3 shows a block diagram of storage cell array in accordance with various embodiments.

FIG. 3 shows a block diagram of storage cell array 202 in accordance with various embodiments. Storage cell array 202 may include word lines 302-312 which correspond to the rows of storage cell array 202 and columns 322-328. Each of columns 322-328 may be comprised of a differential pair of bit lines. For example, column 322 may be comprised of bit lines 332-334; column 324 may be comprised of bit lines 336-338; column 326 may be comprised of bit lines 340-342; and column 328 may be comprised of bit lines 344-346. At the intersection of each of the word lines 302-312 and the columns 322-328, are the storage cells, such as storage cells 352, 354 and 356, that make up storage cell array 202.

Each of the storage cells in storage array 202, such as storage cells 352, 354, and 356 may be arranged to store a single bit of data. In some embodiments, each of the storage cells comprises a six-transistor ("6T") SRAM cell that is formed with a pair of cross-coupled inverters. Each inverter includes a p-channel transistor and an n-channel transistor. The source of a first pass gate transistor is connected to the gate nodes of the first inverter and the drain nodes of the second inverter. Similarly, the source of a second pass gate transistor, is connected to the gate nodes of the second inverter and the drain nodes of the first inverter. The gates of the pass gate transistors are connected to a common word line, such as word line 302 for storage cells 352 and 354 and word line 308 for storage cell 356, while the drains of the pass gate transistors are connected to a differential pair of bit lines, such as bit lines 332 and 334 for storage cells 352 and 356 and bit lines 336 and 338 for storage cell 354. In alternative embodiments, the storage cells of storage array 202 may be any type of SRAM bit cell, such as a four-transistor ("4T") SRAM cell, an eight-transistor ("8T") SRAM cell, a ten-transistor ("10T") SRAM cell, or any other SRAM storage cell.

Returning to FIG. 2, read controller 204 is coupled to storage cell array 202 and is configured to manage the reading of the storage cells contained in storage cell array 202. Read controller 204 may be any type of memory controller that manages the flow of data going from and to storage cell array 202. At the beginning of a read cycle, read controller 204 is configured to cause each of the differential pairs of bit lines (both positive and negative signals) to precharge to a common voltage. In order to read any of the storage cells, the word line corresponding to the storage cell to be read is activated. For example, if storage cell 352 is to be read, then word line 302 is activated. In some embodiments, a row controller (not shown) may cause the word line to activate. Once the word line is activated, each of the pass gate transistors from each of the storage cells on the activated word line is enabled. For example, if word line 302 is activated, then pass gate transistors in storage cells 352 and 354, as well as the pass gate transistors for any other storage cell connected to word line 302 are enabled. This causes the bit line voltage for one of the two differential pairs of bit lines connected to each of the storage cells to drop based on whether the storage cell connected to the differential pair stores a 0 or a 1. For example, once word line 302 is activated, the voltage along bit line 332 or 334 will drop based on whether storage cell 352 stores a 0 or a 1. Similarly, the voltage along bit line 336 or 338 will drop based on whether storage cell 354 contains a 0 or a 1.

Column decoder 206 determines which of the columns 322-328 from FIG. 3 contains the storage cell that is to be read. More specifically, column decoder 206 is configured to receive an output signal from each of the columns 322-328 and select the output signal form the column corresponding to the storage cell being read. Each of the output signals corresponds to the differential voltage carried in the differential pair of bit lines. For example, if storage cell 352 is to be read, column decoder 206 selects column 322 and its differential pair of bit lines 332-334. Sense amplifier 208 then may sense which of the selected differential pair of bit lines has the higher voltage through amplification, thus determining whether the storage cell stores a 0 or a 1. In other words, the sense amplifier 208 is configured to determine the state of the selected column by sensing the column voltage differential. Continuing the previous example, once column decoder 206 selects column 322, the sense amplifier 208 will sense, or determine, which of bit lines 332 and 334 has a higher voltage. Once this is determined, the state of storage cell 352 is able to be determined. In some embodiments, multiple sense amplifiers 208-210 may be present. The ellipsis between the sense amplifiers 208-210 indicates that there may be any number of sense amplifiers, although, for clarity, only two are shown. For example, each column 322-328 may have its own sense amplifier. In other examples, a single sense amplifier may be utilized to sense the differential for 4 columns, 8 columns, 16 columns, 32 columns, etc. of the storage cell array 202.

Figure 4:
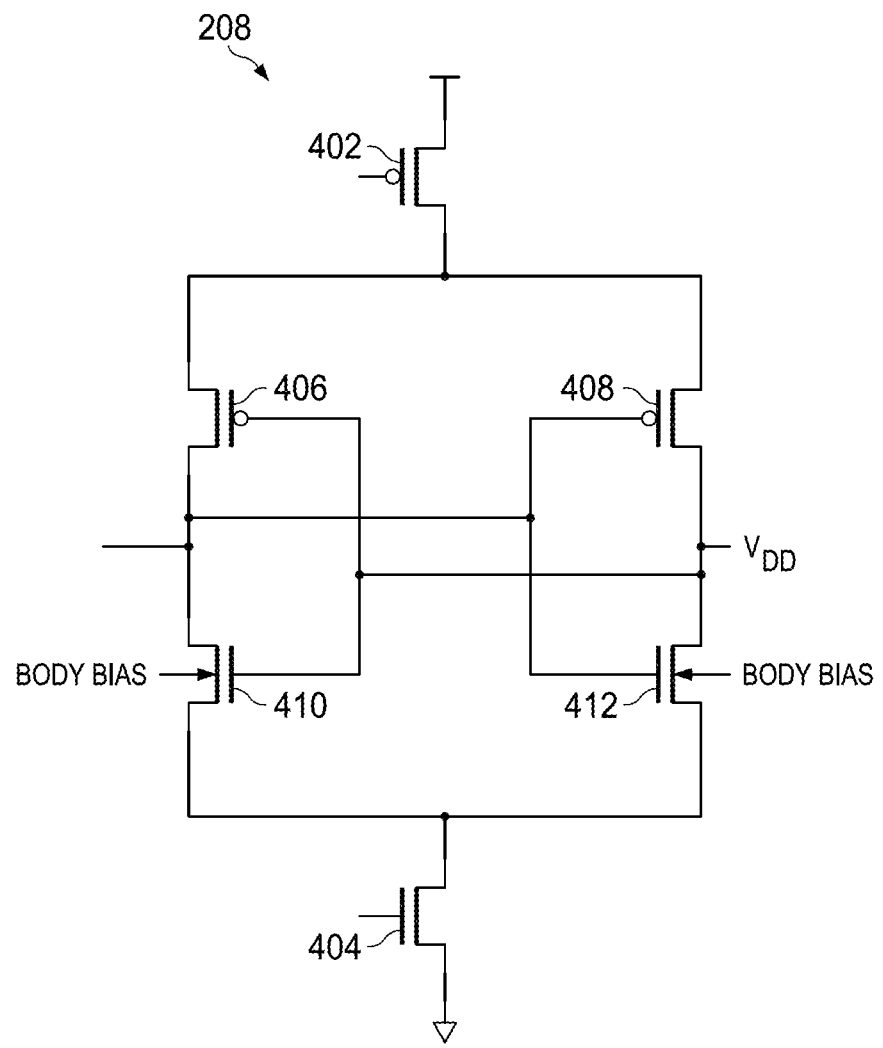
FIG. 4 shows a circuit diagram of a sense amplifier in accordance with various embodiments.

FIG. 4 shows an exemplary circuit diagram of sense amplifier 208 in accordance with various embodiments. Sense amplifier 208 may comprise switches 402 and 404 and cross coupled transistors 406-412. In some embodiments, switches 402 and 404 act to turn on and off the sense amplifier 208. In other words, after column decoder 206 selects the column that is to be sensed, switches 402-404 may be switched open and/or closed in such a way, that sense amplifier 208 is turned on and begins to sense the voltage differential between the bit lines. For example, once column decoder 206 selects column 322 to be sensed, in order to read storage cell 352, switches 402-404 are switched open and/or closed so that the remaining components, such as transistors 406-412, of sense amplifier 208 may sense the voltage differential between bit lines 332-334.

Sense transistors 410-412 are configured to read the data stored in at least one storage cell. In some embodiments, sense transistors 410-412 are NMOS transistors. While shown as NMOS transistors in FIG. 4, in some embodiments, sense transistors 410-412 may be p-channel metal-oxide-semiconductor field-effect (PMOS) transistors, p-type junction gate field-effect transistors (PJFET), n-type junction gate field-effect transistors (NJFET), and/or bipolar junction transistors (BJT) (including PNP and NPN transistors). Because of the manufacturing process (and many other potential reasons), sense transistors 410-412 may not have the same voltage threshold even though the sense amplifier 208 is designed such that the sense transistors 410-412 have the same voltage threshold. Therefore, there may be an offset between the two sense transistors 410-412. Hence, sense transistor 410, in an embodiment, is configured to receive a body bias such that its voltage threshold is approximately equal (i.e., plus or minus 50 mV) to the voltage threshold of sense transistor 412. In alternative embodiments, sense transistor 412 is configured to receive a body bias such that its voltage threshold is approximately equal (i.e., plus or minus 50 mV) to the voltage threshold of sense transistor 410.

In some embodiments, an iterative calibration process may be utilized to determine the body bias that is to be applied to sense transistor 410 and/or 412. For example, data may be written to storage cell array 202. In some embodiments, known data is written to specific storage cells, such as storage cells 352 and 354. In other words, the data contained in storage cells 352 and 354 is known prior to it being read. Initially, the forward body bias of each of sense transistors 410 and 412 may be set to zero. In other words, no forward body bias is applied to sense transistors 410 and 412 initially. The margin mode of the sense amplifier may be set to its fastest setting. The margin mode is the amount of time or the amount of voltage discharge in the bit cell that is allowed to pass prior to triggering or turning on the sense amplifier 208 to read the voltage differential in the bit lines. Thus, with a faster margin mode, the sense amplifier 208 reads the voltage differential of the bit lines faster (i.e., after less bit cell discharge) than in other modes of operation. A read operation then may be performed. For example, bit cell 352 may be read.

If the read fails (i.e., if the sense amplifier 208 fails to correctly read the known data stored in bit cell 352), then the forward body bias of sense transistor 410 may be incremented by a predetermined voltage and the process repeats with reading storage cell 352 to determine whether sense amplifier 208 correctly reads the data stored in storage cell 352. In other words, the read of storage cell 352 then may be repeated with the forward body bias of sense transistor 410 being incremented after each read fail. However, if the maximum allowable forward body bias for sense transistor 410 has been reached, then the forward body bias of sense transistor 410 may be reset to zero. Additionally, the forward body bias of sense transistor 412 may be incremented by a predetermined voltage. The read of storage cell 352 then may be repeated with the forward body bias of sense transistor 412 being incremented after each read fail.

Once the read passes (i.e., if the sense amplifier 208 correctly reads the known data stored in bit cell 352), then the forward body bias calibration may end and the forward body bias settings (i.e., the forward body bias applied to each of sense transistors 410-412 at the time the read passes) may be stored or saved in a memory of the integrated circuit 100 (not shown) and the same process may be utilized to calibrate sense amplifier 210 by reading storage cell 354. In some embodiments, multiple reads of storage cell 352 may be performed to verify that the sense amplifier 208 is correctly reading the storage cell 352.

Figure 5:
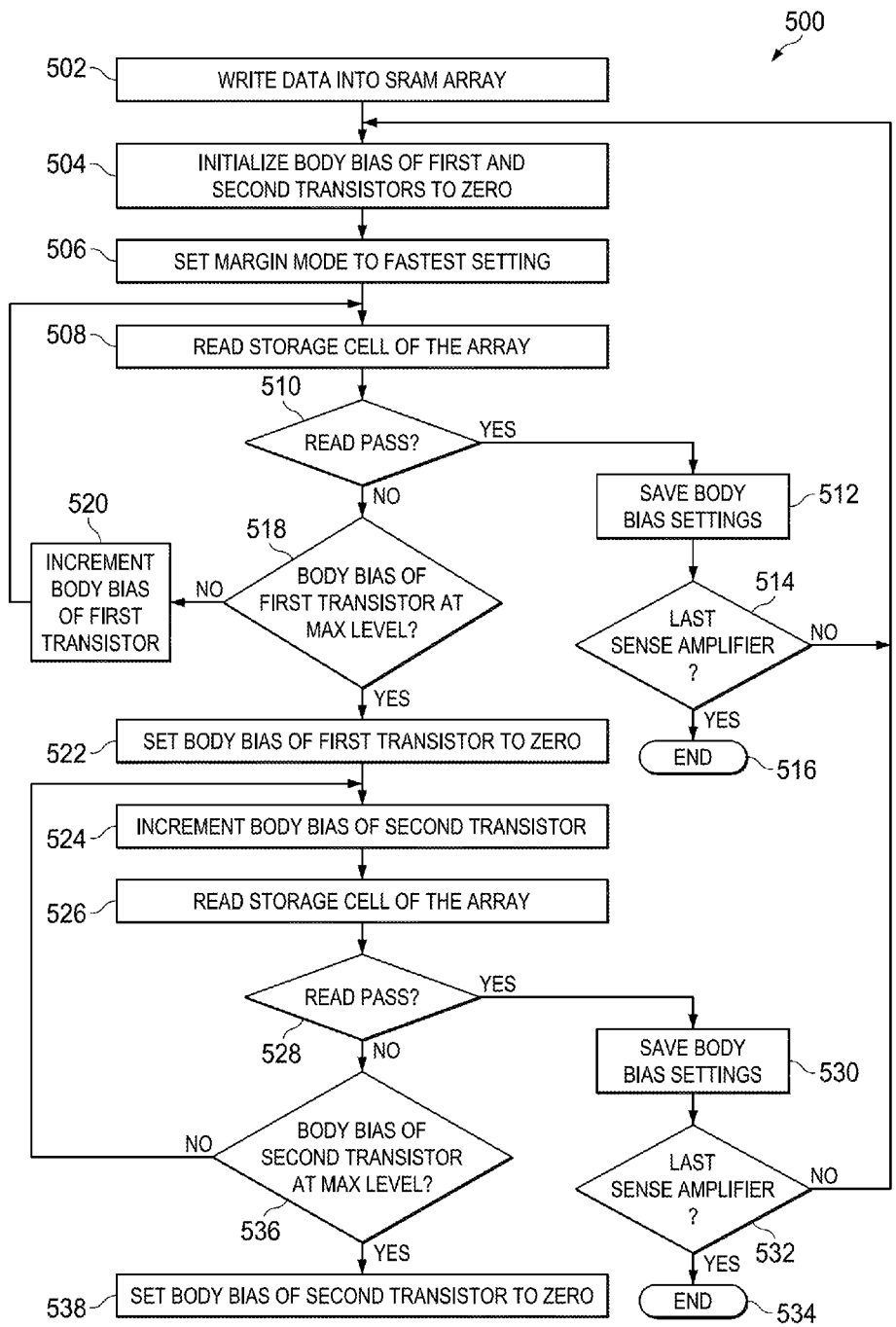
FIG. 5 shows a flow diagram of a method for reducing power consumption and increasing speed in SRAM in accordance with various embodiments.

FIG. 5 shows a flow diagram of method 500 for reducing power consumption and increasing speed in SRAM 104 in accordance with various embodiments. Though depicted sequentially as a matter of convenience, at least some of the actions shown in method 500 can be performed in a different order and/or performed in parallel. Additionally, some embodiments may perform only some of the actions shown or may perform additional actions. In some embodiments, at least some of the operations of the method 500, as well as other operations described herein, can be performed by SRAM 104 and/or sense amplifiers 208-210 implemented by a processor executing instructions stored in a non-transitory computer readable storage medium or a state machine.

Method 500 begins in block 502 with writing data into a SRAM array, such as storage array 202. The data that is written into the SRAM array may be known data. In other words, the contents of the storage cells of the SRAM array are known prior to being read from the array. In block 504, the method 500 continues with initializing the body bias of first and second transistors, such as sense transistors 410-412, of a sense amplifier, such as sense amplifier 208, to zero. In other words, no forward body bias is applied to the first and second transistors when initialized. The method 500 continues with setting the margin mode of the sense amplifier to the fastest setting. Thus, the sense amplifier is set to trigger at the earliest possible time and least amount of bit cell discharge.

In block 508, the method 500 continues with reading a storage cell, such as storage cell 352, of the SRAM array. The method 500 continues in block 510 with determining whether the read from block 508 has passed. In other words, a determination is made as to whether the sense amplifier correctly read the known data stored in the storage cell. If, in block 510, a determination is made that the read from block 508 has passed (i.e., a determination is made that the sense amplifier has correctly read the known data stored in the storage cell), then in block 512, the method 500 continues with saving the body bias settings (i.e., the body bias applied to the first and second transistors) at the time of the reading in block 508. In block 514, the method 500 continues with determining whether any other sense amplifiers, such as sense amplifier 210, remain to be calibrated in the SRAM. If, in block 514, a determination is made that this is the last sense amplifier in the SRAM to be calibrated, then the method 500 ends in block 516. However, if, in block 514, a determination is made that this is not the last sense amplifier in the SRAM to be calibrated (e.g., sense amplifier 210 needs to be calibrated), then the method continues in block 504 with initializing the body bias of a first and second transistor of the new sense amplifier, such as sense amplifier 210, to zero.

If, in block 510, a determination is made that the read from block 508 has not passed (i.e., a determination is made that the sense amplifier has failed to correctly read the known data stored in the storage cell), then in block 518, the method 500 continues with determining whether the body bias of the first transistor is at a maximum level, which may be predetermined. If, in block 518, a determination is made that the body bias of the first transistor is not at the maximum level, then the method 500 continues in block 520 with incrementing the body bias of the first transistor. In some embodiments, the amount that the body bias of the first transistor is incremented is predetermined. The method 500 then may continue in block 508 with reading the storage cell of the array.

If, in block 518, a determination is made that the body bias of the first transistor is at the maximum level, then the method 500 continues in block 522 with setting the body bias of first transistor to zero. In block 524, the method 500 continues with incrementing the body bias of the second transistor, such as transistor 412. In some embodiments, the amount that the body bias of the second transistor is incremented is predetermined. In block 526, the method 500 continues with reading the storage cell of the array again.

The method 500 continues in block 528 with determining whether the read from block 528 has passed (i.e., whether the sense amplifier correctly read the known data stored in the storage cell). If, in block 528, a determination is made that the read from block 526 has passed (i.e., a determination is made that the sense amplifier has correctly read the known data stored in the storage cell), then in block 530, the method 500 continues with saving the body bias settings (i.e., the body bias applied to the first and second transistors) at the time of the reading in block 526. In block 532, the method 500 continues with determining whether any other sense amplifiers, such as sense amplifier 210, remain to be calibrated in the SRAM. If, in block 532, a determination is made that this is the last sense amplifier in the SRAM to be calibrated, then the method 500 ends in block 534. However, if, in block 532, a determination is made that this is not the last sense amplifier in the SRAM to be calibrated (e.g., sense amplifier 210 needs to be calibrated), then the method continues in block 504 with initializing the body bias of a first and second transistor of the new sense amplifier, such as sense amplifier 210, to zero.

If, in block 528, a determination is made that the read from block 526 has not passed (i.e., a determination is made that the sense amplifier has failed to correctly read the known data stored in the storage cell), then in block 536, the method 500 continues with determining whether the body bias of the second transistor is at a maximum level, which may be predetermined. If, in block 536, a determination is made that the body bias of the second transistor is not at the maximum level, then the method 500 continues in block 524 with incrementing the body bias of the second transistor. In some embodiments, the amount that the body bias of the second transistor is incremented is predetermined. However, if in block 536, a determination is made that the body bias of the second transistor is at the maximum level, then the method 500 continues in block 538 with setting the body bias of the second transistor to zero.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A static random access memory (SRAM), comprising:
   an array of storage cells arranged as rows and columns, and comprising word lines that correspond to the rows and bit lines that correspond to the columns; and
   a first sense amplifier including a first transistor and a second transistor, the first sense amplifier configured to:
      provide a first read of a first storage cell of the array of storage cells;
         based on the first read of the first storage cell failing to correctly read data stored in the first storage cell, increment a body bias of the first transistor a first time; and
      in response to the body bias of the first transistor being incremented, provide a second read of the first storage cell;
   wherein the first sense amplifier is further configured to:
      based on the second read failing to correctly read the data stored in the first storage cell, determine whether the body bias of the first transistor is at a maximum level; and
      based on the body bias of the first transistor being at the maximum level, incrementing a body bias of the second transistor.

2. The SRAM of claim 1, wherein the sense amplifier is further configured to, based on the body bias of the first transistor being less than the maximum level, incrementing the body bias of the first transistor a second time.

3. The SRAM of claim 1, wherein the sense amplifier is further configured to, based on the second read correctly reading the data stored in the first storage cell, save the body bias applied to the first transistor during the second read.

4. A static random access memory (SRAM), comprising:
an array of storage cells arranged as rows and columns, and comprising word lines that correspond to the rows and bit lines that correspond to the columns; and
a first sense amplifier including a first transistor and a second transistor, the first sense amplifier configured to:
provide a first read of a first storage cell of the array of storage cells;
based on the first read of the first storage cell failing to correctly read data stored in the first storage cell, increment a body bias of the first transistor a first time; and
in response to the body bias of the first transistor being incremented, provide a second read of the first storage cell;
further comprising a second sense amplifier comprising a third transistor and a fourth transistor, the second sense amplifier configured to:
based on the second read correctly reading the data stored in the first storage cell:
perform a third read of a second storage cell of the array of storage cells, the second storage cell being in a different column of the array of storage cells as the first storage cell; and
based on the third read of the second storage cell failing to correctly read data stored in the second storage cell, increment a body bias of the third transistor a first time.

5. The SRAM of claim 4, wherein the second sense amplifier is further configured to:
based on the third read failing to correctly read the data stored in the second storage cell, determine whether the body bias of the third transistor is at a maximum level; and
based on the body bias of the third transistor being at the maximum level, incrementing a body bias of the fourth transistor.

6. A method for reducing power consumption and increasing speed in a static random access memory (SRAM), comprising:
writing known data into a plurality of storage cells of an array of storage cells arranged as rows and columns;
reading a first storage cell of the plurality of storage cells a first time;
based on the reading of the first storage cell the first time failing to correctly read the known data from the first storage cell, incrementing a body bias of a first transistor of a first sense amplifier of the SRAM; and
in response to the body bias of the first transistor being incremented, reading the first storage cell a second time;
further comprising:
based on the reading the second time failing to correctly read the known data from the first storage cell, determining whether the body bias of the first transistor is at a maximum level;
based on the body bias of the first transistor being at the maximum level, incrementing a body bias of a second transistor of the first sense amplifier.

7. The method of claim 6, further comprising, based on a reading the second time correctly reading the known data from the first storage cell, saving the body bias applied to the first and second transistors at a time of the reading the second time.

8. The method of claim 6, further comprising, prior to reading the first storage cell the first time, initializing the body bias of the first transistor and the second transistor to zero.

9. The method of claim 6, wherein the first and second transistors are n-channel metal oxide semiconductor field effect (NMOS) transistors.

10. A method for reducing power consumption and increasing speed in a static random access memory (SRAM), comprising:
writing known data into a plurality of storage cells of an array of storage cells arranged as rows and columns;
reading a first storage cell of the plurality of storage cells a first time;
based on the reading of the first storage cell the first time failing to correctly read the known data from the first storage cell, incrementing a body bias of a first transistor of a first sense amplifier of the SRAM; and
in response to the body bias of the first transistor being incremented, reading the first storage cell a second time;
further comprising, prior to reading the first storage cell the first time, setting a margin mode of the SRAM to a fastest setting.

11. A method for reducing power consumption and increasing speed in a static random access memory (SRAM), comprising:
writing known data into a plurality of storage cells of an array of storage cells arranged as rows and columns;
reading a first storage cell of the plurality of storage cells a first time;
based on the reading of the first storage cell the first time failing to correctly read the known data from the first storage cell, incrementing a body bias of a first transistor of a first sense amplifier of the SRAM; and
in response to the body bias of the first transistor being incremented, reading the first storage cell a second time;
further comprising, based on a reading the second time correctly reading the known data from the first storage cell:
reading a second storage cell of the plurality of storage cells, the second storage cell being in a different column of the array of storage cells as the first storage cell; and
based on the reading the second storage cell failing to correctly read the known data from the second storage cell, incrementing a body bias of a first transistor of a second sense amplifier of the SRAM.

12. The method of claim 11, further comprising, based on the reading the known data from the second storage cell correctly, saving the body bias applied to the first and second transistors.

* * * * *